United States Patent
Saito et al.

(10) Patent No.: US 7,240,309 B2
(45) Date of Patent: Jul. 3, 2007

(54) DESIGN CHECK SYSTEM, DESIGN CHECK METHOD AND DESIGN CHECK PROGRAM

(75) Inventors: Yoshiyuki Saito, Osaka (JP); Tokuzo Kiyohara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 291 days.

(21) Appl. No.: 10/759,114

(22) Filed: Jan. 20, 2004

(65) Prior Publication Data

US 2004/0250222 A1 Dec. 9, 2004

(30) Foreign Application Priority Data

Jan. 20, 2003 (JP) ............................. 2003-010665

(51) Int. Cl.
*G06F 17/50* (2006.01)
(52) U.S. Cl. .................................. 716/5; 716/4; 716/6
(58) Field of Classification Search ................ 716/4–6
See application file for complete search history.

(56) References Cited

U.S. PATENT DOCUMENTS

| | | | |
|---|---|---|---|
| 5,544,067 A * | 8/1996 | Rostoker et al. ............... 703/14 |
| 5,559,997 A * | 9/1996 | Tsuchida et al. ................. 716/1 |
| 5,864,875 A * | 1/1999 | Van Huben et al. ......... 707/200 |
| 5,949,701 A * | 9/1999 | Saito et al. ..................... 365/63 |
| 6,110,213 A * | 8/2000 | Vinciarelli et al. ............. 703/1 |
| 6,629,305 B2 * | 9/2003 | Ito et al. ......................... 716/11 |
| 6,987,581 B2 * | 1/2006 | Silverbrook et al. ........ 358/1.15 |
| 2003/0097246 A1* | 5/2003 | Hara et al. ..................... 703/14 |

FOREIGN PATENT DOCUMENTS

JP P2002-157280 A 5/2002

* cited by examiner

*Primary Examiner*—Thuan Do
*Assistant Examiner*—Naum Levin
(74) *Attorney, Agent, or Firm*—McDermott Will & Emery LLP

(57) ABSTRACT

In a system that provides CAD layout-design information, by having the user acquire information such as circuit design or CAD layout data registered in a database, the user can analyze the acquired information, so there is a possibility that circuit-design or circuit-board-design know-how could be leaked. With this invention, a characteristic-parameter-extraction means extracts characteristic parameters from a position where there is a possibility of the occurrence of poor electrical characteristics due to an influence of the CAD layout of the input CAD layout data. A correction-determination means determines whether or not it is necessary to correct the layout by comparing the characteristic parameters and correction-determination standards that correspond to poor electrical characteristics read from a database. This makes it possible to check the electrical characteristics of the CAD layout without making available to the user the correction-determination standards or determination method.

20 Claims, 21 Drawing Sheets

FIG.3

| Item number | Position-specification conditions | Characteristic-parameter items |
|---|---|---|
| 1 | Slits in the ground plane<br>Signal line extends across the slit. | Frequency of the signal transmitted along the signal line<br>Amount of current flowing in the signal line<br>Area of the plane formed by the signal line and the return-current path |
| 2 | LSI<br>Via hole connected to the power-supply plane<br>Bypass capacitor<br>Power-supply line | Coordinates of the LSI power-supply pins<br>Coordinates of the power-supply lines<br>Coordinates of the bypass capacitors<br>Coordinates of the via holes connected to the power-supply plane |
| 3 | Signal line formed on the top plane on the edge of the circuit board | Distance between the edge of the circuit board and the signal line<br>Layer on which a signal line is located<br>Maximum frequency of the signal transmitted in the signal line<br>Circuit-board layer construction |
| 4 | Ground plane<br>Power-supply plane | Circuit-board layer construction<br>Coordinates of the power-supply plane<br>Coordinates of the ground plane |
| ... | ... | ... |

31: Item numbers  32: Position-specification conditions  33: Characteristic-parameter items

FIG.4

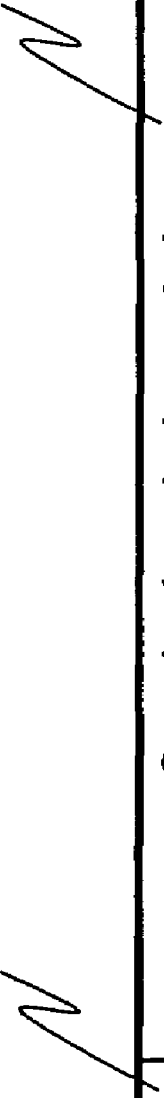

31: Item numbers
34: Correction-determination standards

| Item numbers | Correction-determination standards |
|---|---|
| 1 | The amount of radiated noise calculated from the characteristic parameters exceeds the upper limit. |
| 2 | There is not bypass capacitor on the power-supply line between the via hole and LSI power-supply pin. |
| 3 | A signal line that transmits a signal having a maximum frequency that is greater than a specified frequency is located within a specified distance from the edge of the circuit board. |
| 4 | The edges of the power-supply plane are not on the inside within a specified width with respect to the edges of the ground plane. |
| ... | ... |

FIG.6

22:Web page 1.4 Basic EMI Plan for a PCB Layout (Line Pattern)

[3] Perform layout such that the return-current path is maintained.

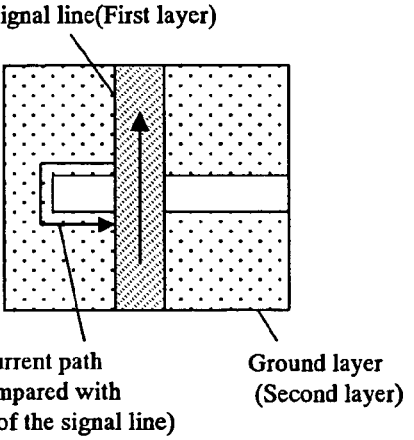

Signal line(First layer)

Return-current path
(long compared with
the path of the signal line)

Ground layer
(Second layer)

Via hole

Occurs when a plurality of via holes
are made close to each other.

Error 12: Detail information
Coordinates (23.825, 121.25)
There is the possibility of an increase of radiated noise.
Cause: There is a high-speed signal line located
on a slit, and the return-current path is long.

Correction method:
(1) Remove the slit under the signal line.
(2) Add a guard (ground) pattern above the slit.
(3) Make the layout of the signal line
follow the path of the return-current.

FIG.13

| Item number | Number of power-supply pins | Characteristic-parameter items |
|---|---|---|
| 100 | LSI | Number of power-supply pins<br>Number of bypass capacitors |
| 101 | LSI | Distance from the LSI power-supply pin to the bypass capacitor |
| ... | ... | ... |

31: Item numbers
32: Position-specification conditions
33: Characteristic-parameter items

FIG.15

| Item number | Position-specification conditions | Characteristic-parameter items |
|---|---|---|
| 200 | Bypass capacitor | Power-supply pin |
| 201 | Damping resistor | IC pin to which the clock signal is input |
| ... | ... | ... |

31: Item numbers
32: Position-specification conditions
33: Characteristic-parameter items

FIG.16

31: Item numbers

35: Layout-design information

| Item number | Information related to the CAD layout |
|---|---|
| 200 | The bypass capacitor is placed such that the distance to the power-supply pin or distance from the outside to the power-supply-input means is a minimum |
| 201 | The damping resistor is placed near the IC pin to which the clock signal is input. |
| ... | ... |

FIG.18
(a)Cross-sectional view
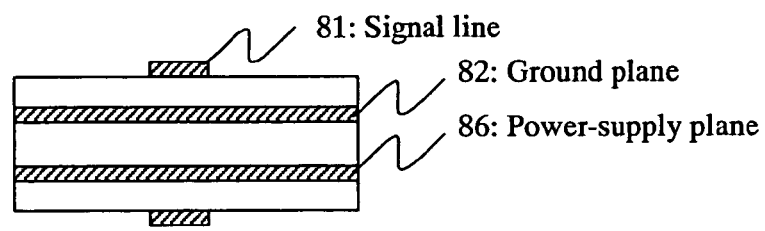
(b) Top view(The insulating layer is omitted.)
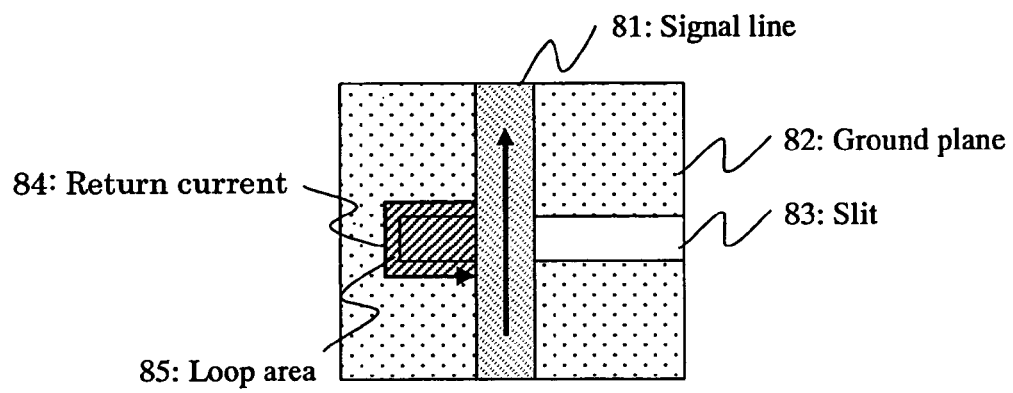

FIG.20
(a) Electric field leakage
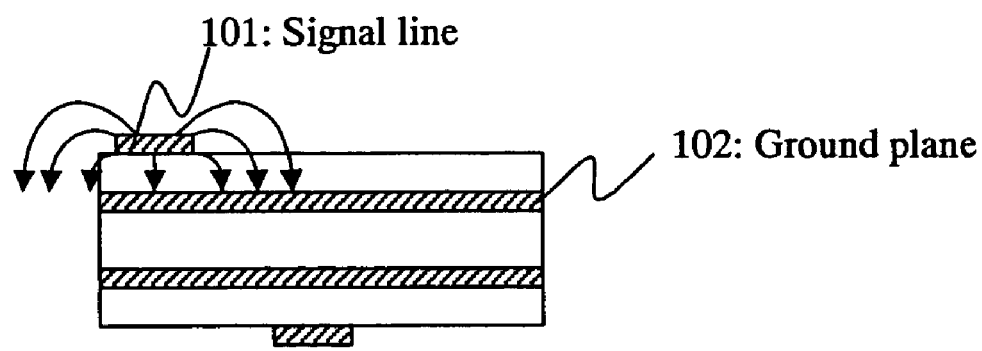
(b) No electric field leakage
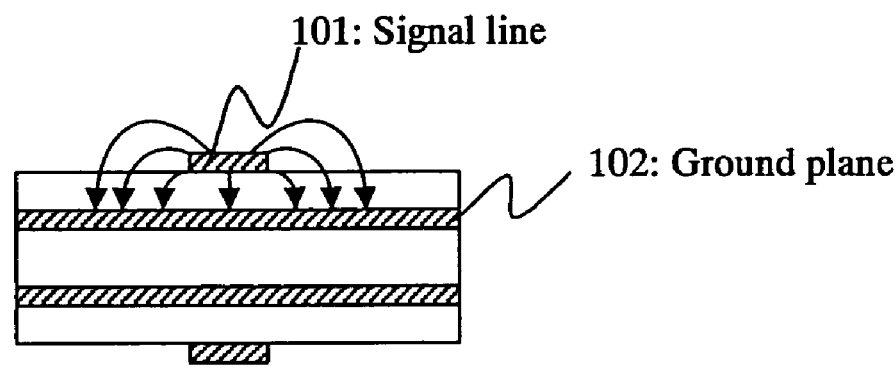

FIG.21
(a) Electric field leakage
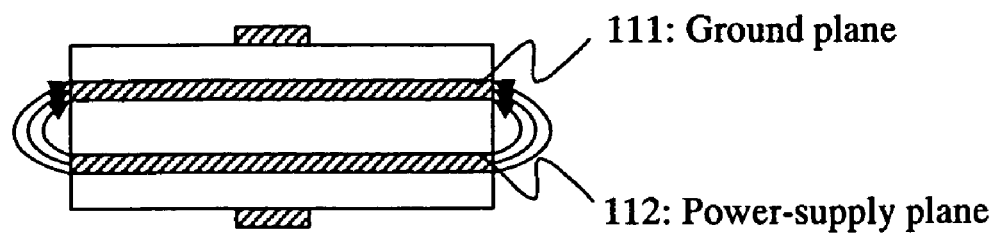
111: Ground plane
112: Power-supply plane
(b) No electric field leakage
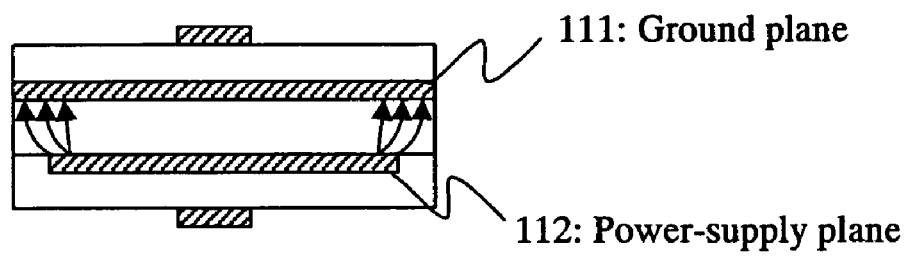
111: Ground plane
112: Power-supply plane

DESIGN CHECK SYSTEM, DESIGN CHECK METHOD AND DESIGN CHECK PROGRAM

BACKGROUND OF THE INVENTION

1. Field of the Invention

This invention relates to CAD (Computer Aided Design), and more particularly to a design-check system, design-check method and design-check program that checks the electrical characteristics of CAD layout data for a printed circuit board.

2. Description of the Related Art

In recent years, digitization and increased performance of AV equipment has been advancing, as well as the digitization, speed and high integration of the LSI inside the AV equipment is advancing. Together with this, the radiated noise that is radiated from the circuit boards on which LSI are mounted is becoming a problem, and thus circuit-board design technology for reducing radiated noise is becoming very important.

Also, as AV equipment has become smaller and more compact, the miniaturization of the circuit boards inside the equipment has advanced, and in order to make them even smaller, build-up boards made from new materials that differ from the conventionally used glass-epoxy material is becoming widely used. In boards made from this kind of new material, the radiation characteristics of the radiated noise differs from the characteristics from a conventional board, so it is necessary to change the design standards and design method according to the board material.

In regards to this, a system has been proposed in which a designer (registrant) that can provide information related to board design and countermeasure examples for suppressing radiated noise in a database via the Internet, and a designer (user) that needs information related to suppressing radiated noise can acquire information by searching the database (for example, Japanese patent unexamined publication No. 2002-157280(Pgs. 4 to 7, FIG. 1)).

In the prior art described above, the registrant registers detail circuit design and board layout in the database as design and countermeasure examples, so by searching the database, the user is able to acquire the detail circuit design and board layout. Therefore, by analyzing the acquired circuit design and board layout, the user not only is able to acquire information related to suppressing radiated noise, but is also able to acquire detail information related to circuit design and board layout.

For the registrant, acquisition of detail information related to the circuit design and board layout by the user is not preferable since it is connected to leaking know-how. Furthermore, there is the danger that the circuit design and board layout acquired by the user will be distributed to a third party free of charge.

SUMMARY OF THE INVENTION

Taking into considerations the problems of the prior art, the object of this invention is to provide a design-check system that prevents the distribution of detail circuit design and board layout information, and charges a fee for access to the database.

The present invention applies the following means in order to accomplish the object mentioned above.

The design-check system of this invention comprises a storage means that stores position-specification conditions that specify a position where there is a possibility that poor electrical characteristics will occur due to an influence of the CAD layout, characteristic-parameter items to be extracted, and correction-determination standards that are standards for determining whether or not it is necessary to correct the CAD layout, which are correlated and registered in a database for each predicted cause of poor electrical characteristics. Also, this design-check system comprises a position-specification means, characteristic-parameter-extraction means, and correction-determination means for checking the electrical characteristics of a CAD layout data.

The position-specification means is used for specifying positions from the CAD layout data where there is a possibility that poor electrical characteristics will occur, based on the position-specification conditions that are stored in the database. Also, the characteristic-parameter-extraction means extracts characteristic parameters according to characteristic-parameter items stored in the database at the positions specified by the position-specification means.

Moreover, the correction-determination means determines whether or not it is necessary to correct the CAD layout data by comparing the characteristic parameters extracted by the characteristic-parameter-extraction means and the correction-determination standards that correspond to the characteristic parameters read from the storage means.

When the design-check system comprises a client apparatus to which the CAD layout data is input and a server apparatus that is connected to the client apparatus via a network, the storage means is located in the server apparatus. Here, the position-specification means, characteristic-parameter-extraction means and correction-determination means can be located in either the server apparatus or client apparatus, however it is preferred that the position-specification means and characteristic-parameter-extraction means be located in the same apparatus.

For example, when the server apparatus comprises the position-specification means, characteristic-parameter-extraction means and correction-determination means, the client apparatus sends the input CAD layout data to the server apparatus. In this case, the server apparatus extracts the characteristic parameters from the received CAD layout data and performs determination, then sends the determination result to the client apparatus.

Also, when the server apparatus comprises the correction-determination means and the client apparatus comprises the position-specification means and characteristic-parameter-extraction means, the client apparatus extracts the characteristic parameters from the CAD layout data and send them to the server apparatus. In this case, the server apparatus uses the received characteristic parameters to perform determination and then sends the determination result to the client apparatus.

Moreover, when the client apparatus comprises the position-specification means, characteristic-parameter-extraction means, and correction-determination means, the client apparatus obtains the correction-determination standards from the server apparatus and performs determination.

When the client apparatus comprises the position-specification means, characteristic-parameter-extraction means, or correction-determination means, each means can be stored as programs in the server apparatus, and the programs can be obtained from the server apparatus as needed and executed.

With any of the kinds of construction described above, the design-check system is capable of checking the electrical characteristics without having to make available information such as the detail circuit design or CAD layout.

The server apparatus may also comprises a billing means for performing billing according to access of the database from the client apparatus. In this invention, since it is not possible to perform the design check without accessing the database, it is possible to perform billing for information by performing billing according to access to the database.

Also, it is possible for the client apparatus to comprise a selection means that is capable of selecting whether or not to display detail information related to the determination result such as an explanation of error or layout correction method registered in the database. By doing this, it is possible to display in stages information related to poor electrical characteristics. Moreover, by restricting the designers who are allowed to access the detail information, it is possible to display detail information only to certain designers.

Furthermore, it is also possible for the server apparatus to comprise a second storage means that collects the characteristic parameters extracted from the CAD layout data, and a statistics-calculation means that calculates statistical values such as an average value of the collected characteristic parameters and sends the statistical values together with the determination result to the client apparatus. By doing this, the user is able to compare his/her own design values with the average design values of other users, and thus is able to known his/her own design trends.

On the other hand, in the design-check system of this invention, when circuit-design data is input instead of CAD layout data, the position-specification means specifies a position from the circuit-design data based on position-specification conditions that can specify the position by just the circuit-design data. When doing this, the server apparatus sends information related to the layout design that corresponds to the position-specification conditions registered in the database.

In this way, the user is able to obtain information related to layout design by performing a design check in the stage of performing circuit design.

Moreover, from another aspect, this invention provides a design-check method comprising the aforementioned steps.

Furthermore, from yet another aspect, this invention provides a program that is executed by a computer to perform the design-check method described above.

In this disclosure, the CAD layout data is circuit-design data such as information that specifies the devices of the circuit (device type, resistance value, capacitance value, etc.) or circuit information (type of transmitted signal, power-supply line, ground, etc.), or physical information related to the CAD layout such as the line length, line width, position of via holes, etc.

Also, poor electrical characteristics due to the CAD layout include radiated noise that is generated due to the location of the line pattern, or distortion of the signal waveform due to signal interference between lines.

Furthermore, the characteristic parameters include information from the CAD layout data that is related to the occurrence of poor electrical characteristics due to an influence of the CAD layout.

In the explanation above, this invention uses the position-specification conditions, characteristic-parameter items and correction-determination standards that are stored in the server as parameters for performing a design check of CAD layout data, so it is possible to check the electrical characteristics of the CAD layout without making available information such as the detail circuit design or CAD layout. Furthermore, since it is not possible for a third party to obtain the determination method or determination standards for determining whether or not it is necessary to correct the layout by analyzing the program of the client apparatus, confidentiality is improved.

Also, in this invention, since neither the determination method nor determination standards for determining whether or not it is necessary to correct the CAD layout data are distributed to a third party, it is possible to perform billing for the information by performing billing according to access of the server apparatus (database).

Furthermore, since there is a selection means that displays in stage the information related to poor electrical characteristics, by restricting the users that can access the detail information, it is possible to display the detail information to only certain users.

These and other objects, features, aspects and advantages of the present invention will become more apparent from the following detail description of the present invention when taken in conjunction with the accompanying drawings.

BRIEF DESCRIPTION OF THE DRAWINGS

FIG. 3 is a drawing explaining the extraction conditions of a first embodiment of the invention.

FIG. 4 is a drawing explaining the correction-determination standards of a first embodiment of the invention.

FIG. 6 is a schematic drawing of the detail-information display of a first embodiment of the invention.

FIG. 13 is a drawing explaining the extraction conditions of a fourth embodiment of the invention.

FIG. 15 is a drawing explaining the extraction conditions of a fifth embodiment of the invention.

FIG. 16 is a drawing explaining the layout-design information of a fifth embodiment of the invention.

FIG. 18(a) and FIG. 18(b) are drawings showing an example of when problems with electrical characteristics occur.

FIG. 20(a) and FIG. 20(b) are drawings showing an example of when problems with electrical characteristics occur.

FIG. 21(a) and FIG. 21(b) are drawings showing an example of when problems with electrical characteristics occur.

DESCRIPTION OF THE PREFERRED EMBODIMENTS

Embodiment 1

The preferred embodiments of the invention will be explained below with reference to the drawings.

Figure 1:
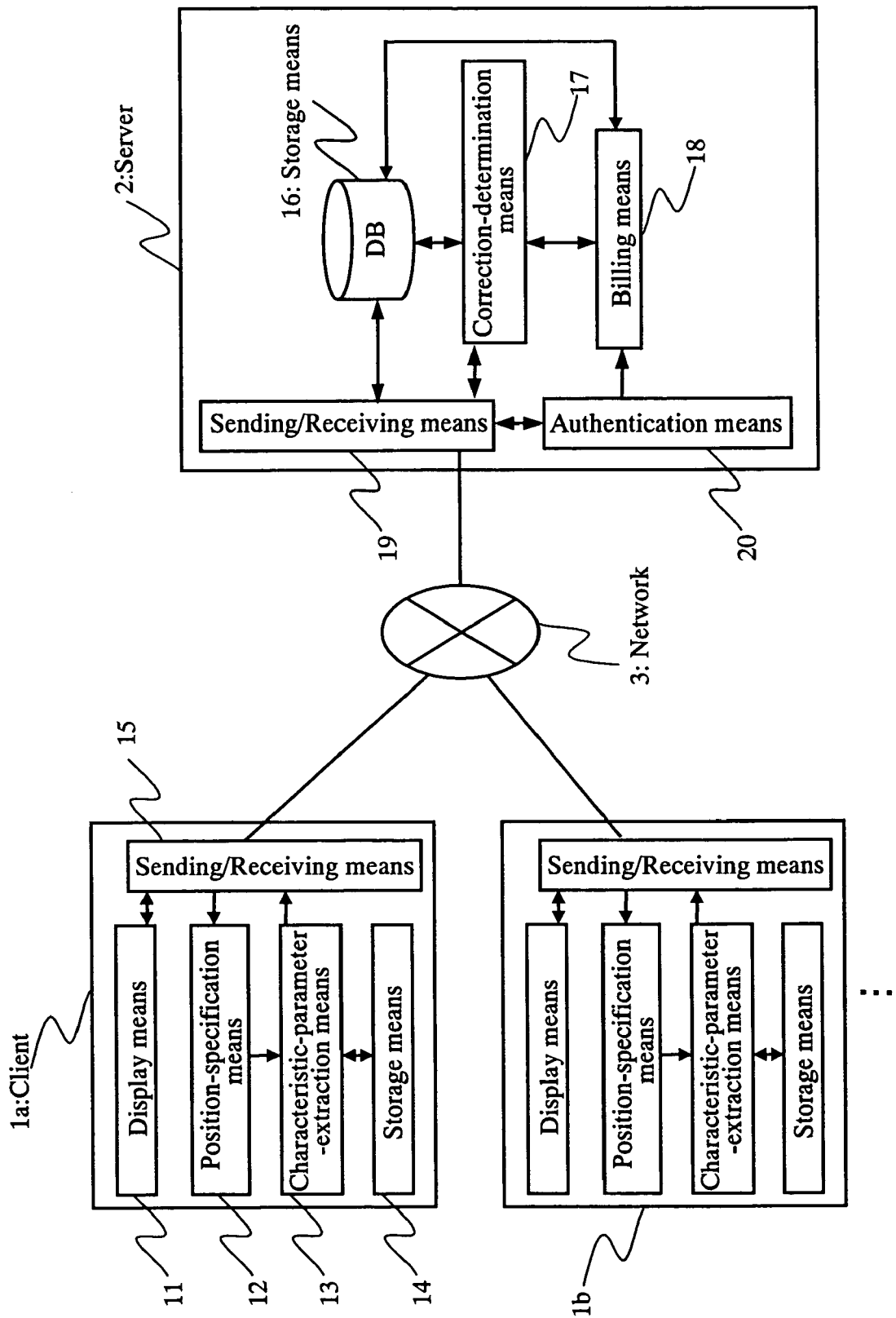
FIG. 1 is a schematic drawing showing the construction of the system of a first embodiment of the invention.
Figure 2:
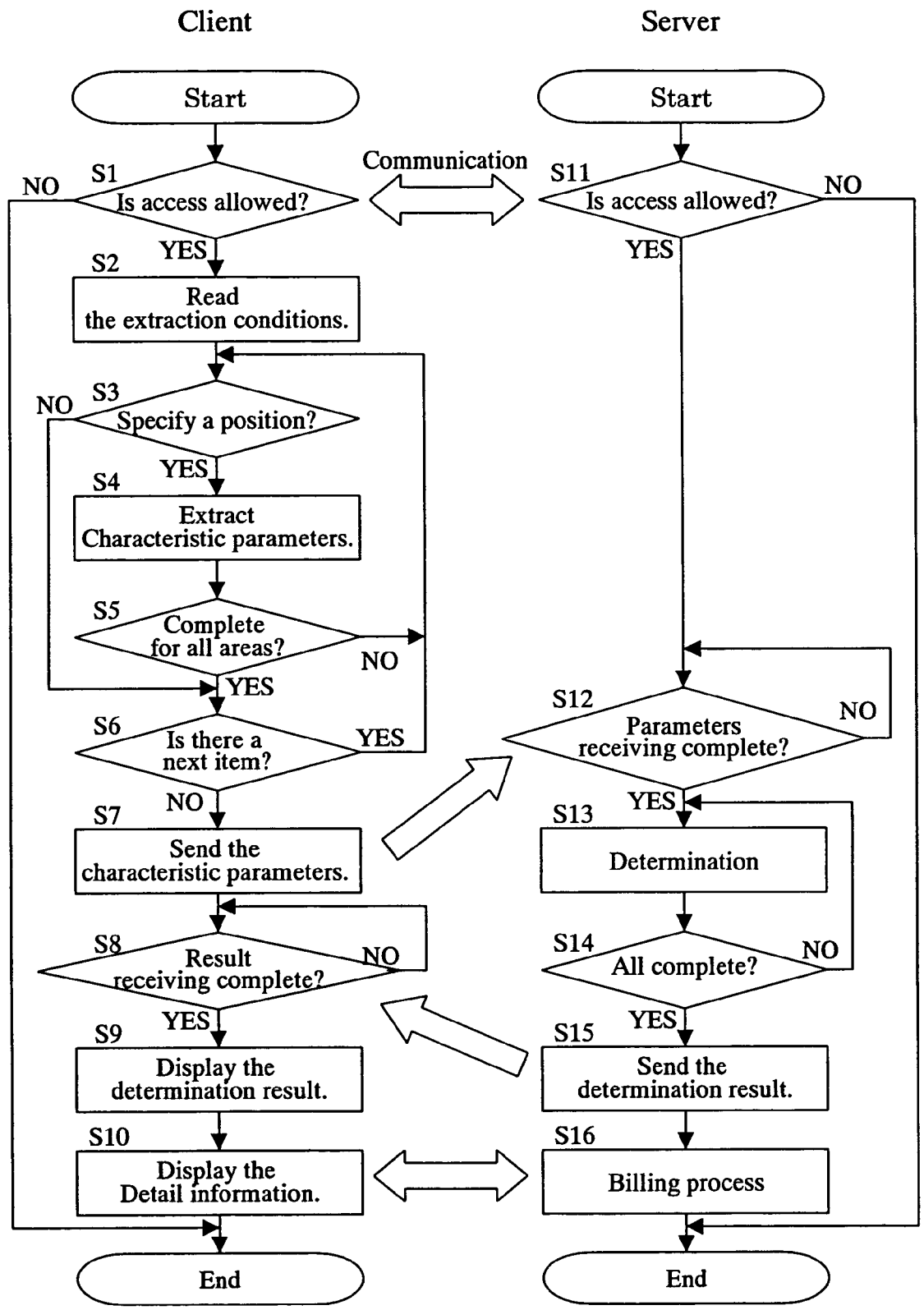
FIG. 2 is a flowchart showing the flow of the processing of a first embodiment of the invention.

FIG. 1 is a schematic drawing showing a first embodiment of the invention. Also, FIG. 2 is a flowchart showing the processing of a client apparatus 1a and server apparatus 2.

The design-check system of this invention executes the design-check process according to the procedure below when a user inputs CAD layout data to a client apparatus 1a, 1b, . . . .

First, position-specification conditions 32 as shown in FIG. 3 and a characteristic-parameter items 33 are paired together and registered in a database stored in a storage means 16 of the server apparatus 2, and item numbers 31 are given to each respective item.

A detail explanation of the each of the items will be given later, however, position-specification conditions 32 and characteristic-parameter items 33 will be explained below using item number '1' as an example.

As shown in FIG. 18(b), with a slit 83 formed in a ground plane 82, when a signal line 81 on a layer above or below it locates across the slit 83, it is easy for radiated noise to occur depending on the amount of current flowing in the signal line 81 or on signal-frequency conditions. In this example, the position-specification conditions 32 are 'the slit in the ground plane and the signal line extending across the slit', and the characteristic-parameter items 33 are 'the frequency of the signal transmitted in the signal line', 'the amount of current flowing in the signal line', and 'the area of the plane constructed by the signal line and loop-current path'.

In the state described above, first, the user inputs CAD layout data to the client apparatus 1a by CAD input or reading a data-file. For example, when the CAD layout data is input by CAD input, a screen 21 comprising a data-display section 51, message-display section 52, and command-display section 53 is displayed on a display means 11 of the client apparatus 1a. In this state, the user inputs CAD layout data to the client apparatus 1a using the group of layout-edit buttons 54 that are located in the command-display section 53.

After the CAD layout data has been input, the design check begins when the user clicks on a check button 55 in the command-display section 53.

First, the client apparatus 1a performs communication with the server apparatus 2 by way of the sending/receiving means 15, 19, and using an apparatus ID or a user ID and password that were input by the user, makes an inquiry with the Authentication means 20 of the server apparatus 2 whether or not access to the database by the client apparatus 1a or user is allowed (FIG. 2, S1 and S11). When access is not allowed, processing between the client apparatus 1a and the server apparatus 2 ends.

When access is allowed, a position-specification means 12 of the client 1a reads all of position-specification conditions 32 and characteristic-parameter items 33 (hereafter, referred to as extraction conditions together with this two items) shown in FIG. 3 and the item numbers 31 (FIG. 2, S2).

Next, a position-specification means 12 follows the order of item numbers 31 to specify positions from the input CAD layout data that coincide with the position-specification conditions 32. Also, only in the case when positions from the input CAD layout data that coincide with the position-specification conditions 32 could be specified, the characteristic-parameter-extraction means 13 extracts characteristic parameters specified by the characteristic-parameter items 33 at the specified positions.

In the example shown in FIG. 3, first, the position-specification means 12 specifies a position that coincides with the position-specification condition 32 of item number '1', which is 'the position where the signal line locates across slit on the ground plane' (FIG. 2, S3). When it is not possible to specify the position that coincides with this position-specification condition 32 for all of the input CAD layout data, the position-specification means 12 checks whether or not there is a next item (FIG. 2, S6). Here, since there is a next item, the position-specification means 12 specifies the position that coincides with the position-specification condition 32 of item number '2'.

On the other hand, when the position-specification means 12 is able to specify a position that coincides with the position-specification condition 32 of item number '1', the characteristic-parameter-extraction means 13 extracts the characteristic-parameter items 33 of item number '1' from the specified position, which are 'the frequency of the signal transmitted in the signal line, the amount of current flowing in the signal line', and the area of the plane formed by the signal line and the return-current path (FIG. 2, S4). At the same time, the characteristic-parameter-extraction means 13 extracts the position information of the CAD layout data, which are position coordinate. Also, the extracted characteristic parameters and coordinates are correlated with the item numbers 31 and stored in the storage means 14 of the client apparatus 1a.

The position-specification process and characteristic-parameter-extraction process are repeated until the process is completed for all of the input CAD layout data (FIG. 2, S5). When the process is completed for all of the input CAD layout data, the position-specification means 12 checks whether or not there is a next item (FIG. 2, S6). Here, since there is a next item, it specifies a position coinciding with the position-specification condition 32 of item number '2'.

When the position-specification process and characteristic-parameter-extraction process are repeated and processing is completed for all of the item numbers 31, the characteristic-parameter-extraction means 13 reads the characteristic parameters, coordinates of the extracted positions and the corresponding item numbers 31 that are stored in the storage means 14 of the client 1a, and sends them to the server apparatus 2 by way of the sending/receiving means 15 (FIG. 2, S7).

A correction-determination means 17 of the server apparatus 2 receives the sent characteristic parameters, coordinates of the extracted positions and the corresponding item numbers 31 by way of the sending/receiving means 19 (FIG. 2, S12). Also, the correction-determination means 17 reads the correction-determination standards 34 that corresponds to the received item numbers 31 from the database stored in the storage means 16, and compares the read correction-determination standards 34 with the received characteristic parameters and determines whether or not it is necessary to correct the CAD layout data (FIG. 2, S13).

The determination is performed to determine whether or not the correction-determination standards 34, as shown in FIG. 4, correlated by the item numbers 31 are met. For example, when the characteristic parameters for item number '1' is sent from the client apparatus 1a, the correction-determination means 17 reads the correction-determination standard 34 of item number '1', which is that 'the amount of radiated noise calculated from the characteristic parameter exceeds the specified maximum value'. Also, it uses a relational expression that will be described later to calculate the amount of radiated noise from the received characteristic parameter.

When this calculated amount of radiated noise exceeds the specified maximum value, the correction-determination means 17 determines that it is necessary to correct the CAD layout data (determines that there is an error), and when the calculated amount of radiated noise does not exceed the specified maximum value, the correction-determination means 17 determines that correction is not necessary.

This determination is performed in order for all of the received characteristic parameters (FIG. 2, S14). Also, after determination has been completed for all of the characteristic parameters, the correction-determination means 17 sends the determination result, for example sends the coordinates of the extracted positions for which the feature parameters that were determined to be in error to the client apparatus 1a (FIG. 2, S15).

With the construction described above, the server apparatus 2 uses the characteristic parameters extracted by the client apparatus 1a determines whether or not to correct the CAD layout, and returns the determination result to the client apparatus 1a, so it is possible to check the electrical characteristics without making information such as detail circuit design or CAD layout data available to the user.

Therefore, there is no danger of distributing information such as detail circuit design or board layout data to other businesses even when there is an open environment where the network 3 is connected to the Internet such that it is possible for other businesses to use the design-check system. Also, it is not possible for a third party to acquire the determination method or determination criteria for determining whether or not correcting the CAD layout is necessary even by analyzing the program of the client apparatus 1a, and so there is high confidentiality.

On the other hand, the client apparatus 1a receives the determination result (FIG. 2, S8), and displays that result on the display means 11 (FIG. 2, S9). In the example shown in FIG. 5, the determination result is displayed in the message-display section 53 of the screen display 21.

This determination result contains the number of positions that were determined to be in error and a URL that indicates a Web page that is a selection means 56 that can display detail information when it is necessary. Then, by referencing this URL, it is possible to acquire detail information related to the errors (FIG. 2, S10). In the example shown in FIG. 5, by clicking on the URL portion displayed in the message-display section 53 of the screen display 21, the browser is activated and it is possible to display the Web page.

As shown in the example of Web page display in FIG. 6, the coordinates of an error position acquired when extracting the characteristic parameter, an explanation of the error that corresponds to the item number 31 registered in the database, and the method for correcting the layout are displayed on the Web page 22 that gives detail information. When referencing this Web page 22, the area for the input CAD layout data that is displayed in the data-display section 51 is highlighted, making it possible to check the position.

For example, by limiting the users who can access this detail information such that only certain users can display the detail information, it is possible to make the detail information available to in-company users, but not make the detail information available to users outside the company.

In the server apparatus 2, when the determination result is sent to the client apparatus 1a, the billing means 18 performs the billing process according to access of the database by the client apparatus 1a (FIG. 2, S16).

The billing means 18 monitors the correction-determination means 17 and access of the database, and performs the billing process for the user or client apparatus 1a, which was confirmed by the Authentication means 20, according to the number of accesses, the access time, the number of errors, provided amount of information, etc. The billing means 18 also performs the billing process when the client apparatus 1a references the Web page 22 that displays the detail information. In addition, by performing identification using the apparatus ID or user ID, it is possible to no perform the billing process for certain IDs of in-company users, for example.

In this invention, as described above, since the determination method and determination criteria for determining whether or not layout correction is necessary are not distributed to a third party, or in other words, since information is not distributed, it is possible to accurately perform billing for the information by performing the billing process according to access of the database.

On the other hand, the design-check system of this invention can be applied as an educational tool of the user as one method of use. When used as an educational tool, information such as theory for the occurrence of poor electrical characteristic that are predicted to occur due to an influence of the CAD layout is further registered in the database, and it is possible to display an explanation of the information using figures and graphs using the Web page specified by the URL.

In this way, when it is determined that it is necessary to correct the layout, the user can reference the theory for the occurrence of poor electrical characteristic, and thus it is possible to improve design performance. Moreover, by having the billing means 18 perform billing according to the number of errors for each user, it is possible to check the user's skill of CAD layout design according the bill total.

In the explanation above, when the design check starts, the position-specification means 12 acquires extraction conditions from the database. However, it is also possible to store the extraction conditions in the storage means 14 of the client apparatus 1a.

By doing this, it is not necessary for the client 1a to acquire extraction conditions from the server apparatus 2 each time when performing the design check, so it is possible to reduce the number of times data is sent and received between the client apparatus 1a and the server apparatus 2. In this case, the position-specification apparatus 12 checks the time stamp at the beginning of each design check for whether or not the database has been changed by the addition of new items or the like, and when the database has been changed, it acquires the extraction conditions from the database and updates the extraction conditions stored in the storage means 14. In this way, by just updating the database stored in the storage means 16 of the server apparatus 2 it is possible for all of the client apparatuses 1a, 1b, . . . connected by way of the network to always perform the design check based on the most recent information.

Figure 7:
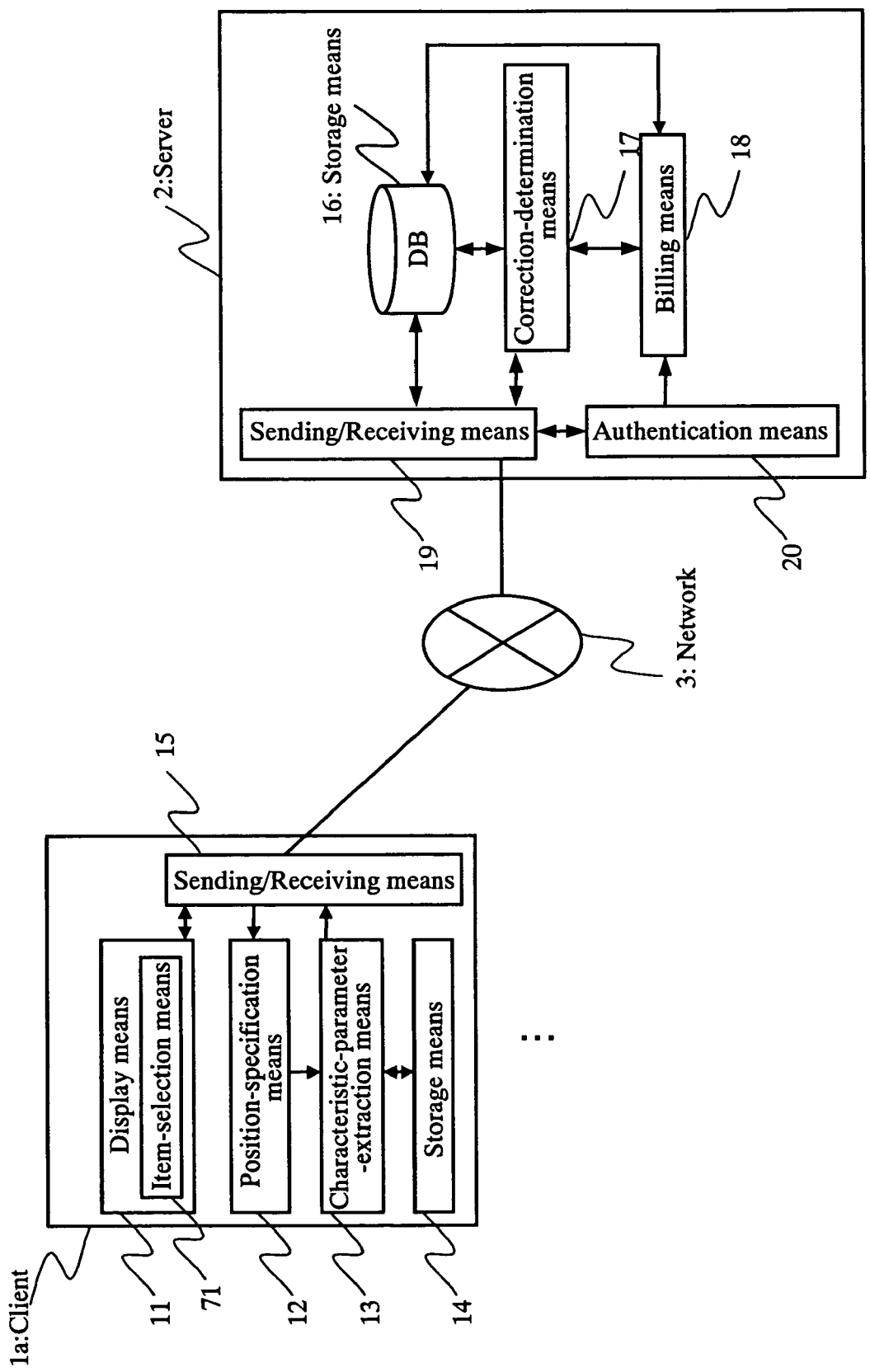
FIG. 7 is a schematic drawing showing another example of the construction of the system of a first embodiment of the invention.

Also, in the explanation above, the case of performing the design check based on all of the check items in the database was explained, however, it is also possible as in the example shown in FIG. 7, to display the design-check items registered in the database in a list on the display of the client apparatus 1a at the start of the design check, and for the user to use the item-selection means 71 that is displayed on the display means 11 to select items for which to perform the design check. By doing this, for example, it becomes possible, when performing the design check again after correcting the CAD layout data based on the result of the design check, to check just check items that resulted in error, and thus it is possible to reduce the check time.

Furthermore, in the explanation above, the client apparatus 1a was constructed such that it comprised beforehand the position-specification means 12 and characteristic-parameter-extraction means 13, however the invention is not limited to this. For example, the same effect can be obtained by constructing the server apparatus 2 such that a program that makes the client apparatus 1a execute the position-specification process and characteristic-parameter-extraction process (FIG. 2, S2 to S6) is stored in the storage means 16, and the client apparatus acquires this program from the server apparatus 2 at the start of the design check.

Also, in the case of construction in which the client apparatus 1a acquires the program from the server apparatus 2 in this way, by deleting the program according to an instruction from the server apparatus 2 when the check of the electrical characteristics of the CAD layout has been completed, it is possible to increase confidentiality even more because a third party cannot analyze the program.

The example of poor electrical characteristics is not limited to this detail example, is just an example and does not limit the technical scope of the invention.

Embodiment 2

Figure 8:
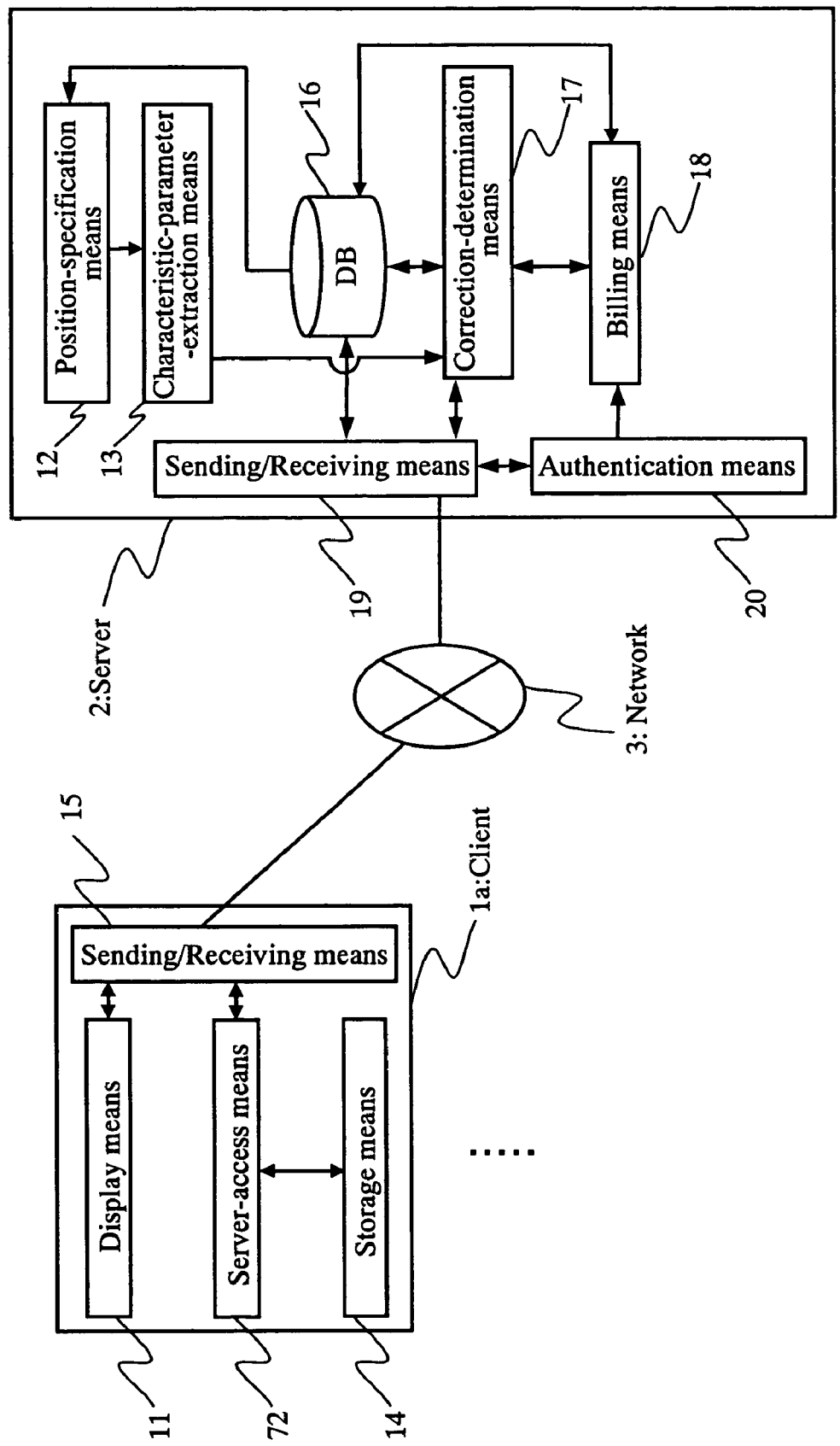
FIG. 8 is a schematic drawing showing a system of a second embodiment of the invention.

Another embodiment of the invention will be explained below with reference to the schematic drawing of FIG. 8 and the flowchart of FIG. 9. In the drawings, the same reference numbers will be used for blocks having the same functions and for steps that perform the same processes as in the first embodiment described above.

In this embodiment, the server apparatus 2 comprises the position-specification means 12 and characteristic-parameter-extraction means 13 that the client apparatus 1a comprised of in the first embodiment, and the client apparatus 1a comprises a server-access means 72 that accesses the server apparatus 2.

Figure 9:
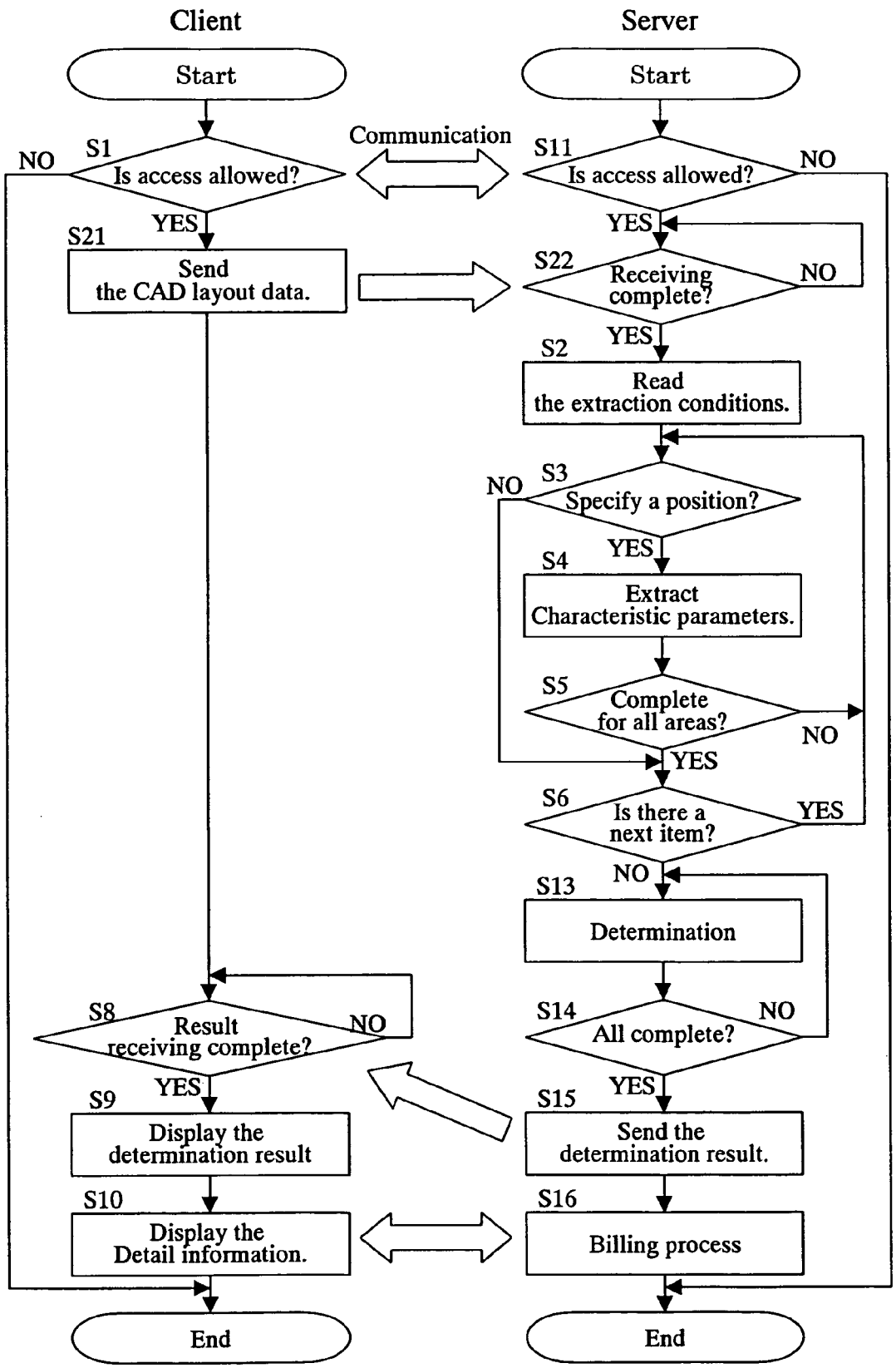
FIG. 9 is a flowchart showing the flow of the processing of a second embodiment of the invention.

In other words, the client apparatus 1a in which the CAD layout data is input performs communication with the server apparatus 2 by way of the server-access means 72, which is a browser or the like, and when access to the database is allowed (FIG. 9, S1), sends the input CAD layout data to the server apparatus 2 (FIG. 9, S21).

After the server apparatus 2 receives the CAD layout data (FIG. 9, S22), the position-specification means 12 and characteristic-parameter-extraction means 13 of the server apparatus 2 performs the position-specification process and characteristic-parameter-extraction process explained above for the first embodiment according to the extraction conditions, and extracts the characteristic parameters and coordinates of the extraction position from the input CAD layout data. (FIG. 9, S2 to S6).

Also, the correction-determination means 17 determines whether or not it necessary to correct the CAD layout data based on the extracted characteristic parameters as was done in the first embodiment (FIG. 9, S13, S14), and sends the determination result and the coordinates of the position where the characteristic parameters were extracted to the client apparatus 1a (FIG. 9, S15). The operation by the client apparatus 1a after it receives the determination result is the same as in the first embodiment, so an explanation of it will be omitted.

In this embodiment, as in the case of the first embodiment, it is possible to check the electrical characteristics without having to make available to the user information such as the detail circuit design or board layout. Also, in this embodiment it is possible to improve confidentiality since checking of the electrical characteristics of the CAD layout data is completely performed by the server apparatus 2.

Embodiment 3

Figure 10:
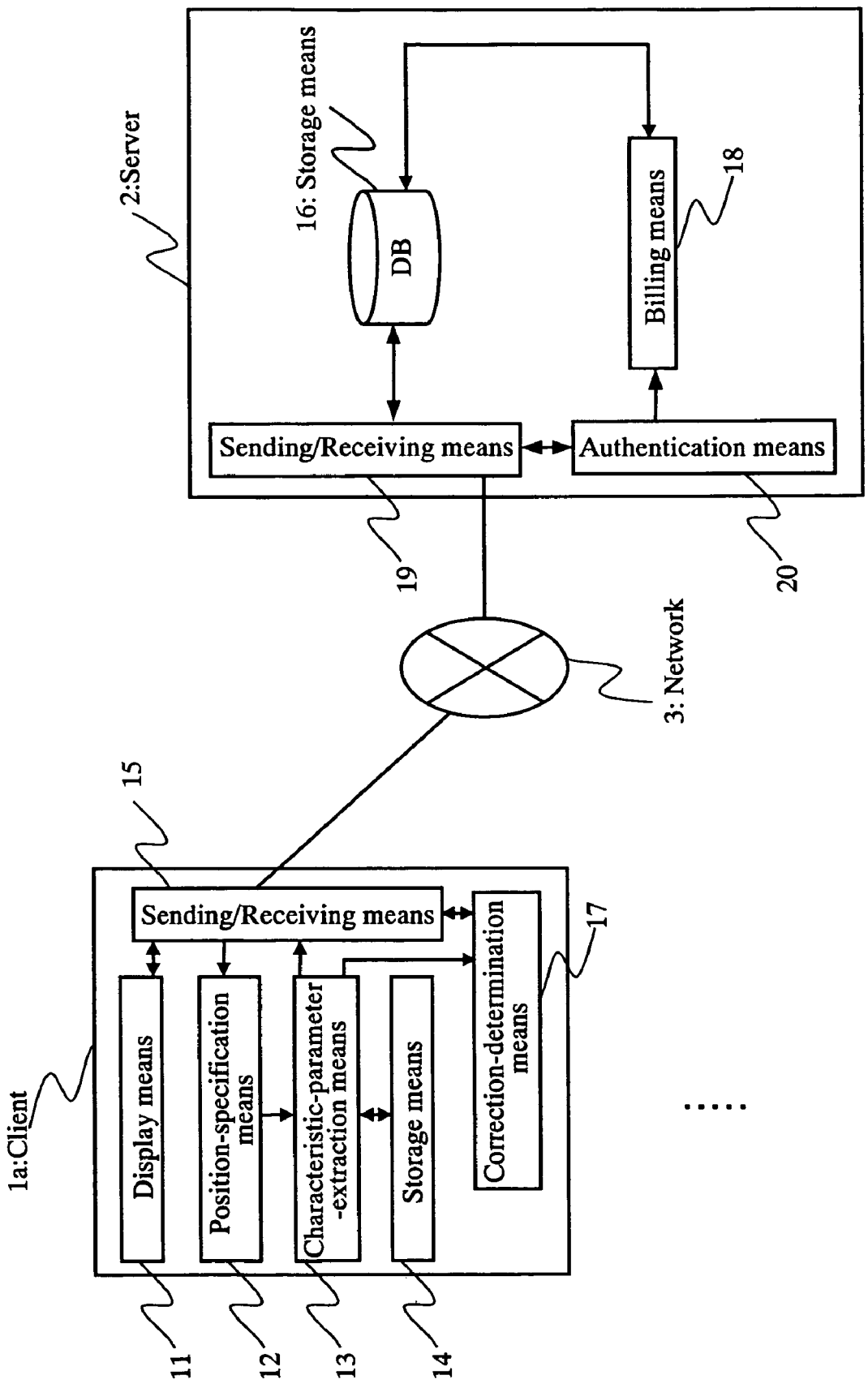
FIG. 10 is a schematic drawing showing the construction of the system of a third embodiment of the invention.

A further embodiment of the invention will be explained below with reference to the schematic drawing shown in FIG. 10 and the flowchart shown in FIG. 11. In the drawings, the same reference numbers will be used for blocks having the same functions and for steps that perform the same processes as in the first embodiment described above.

In this embodiment, the client apparatus 1a comprises the correction-determination 12 that was part of the server apparatus 2 in the first embodiment.

Figure 11:
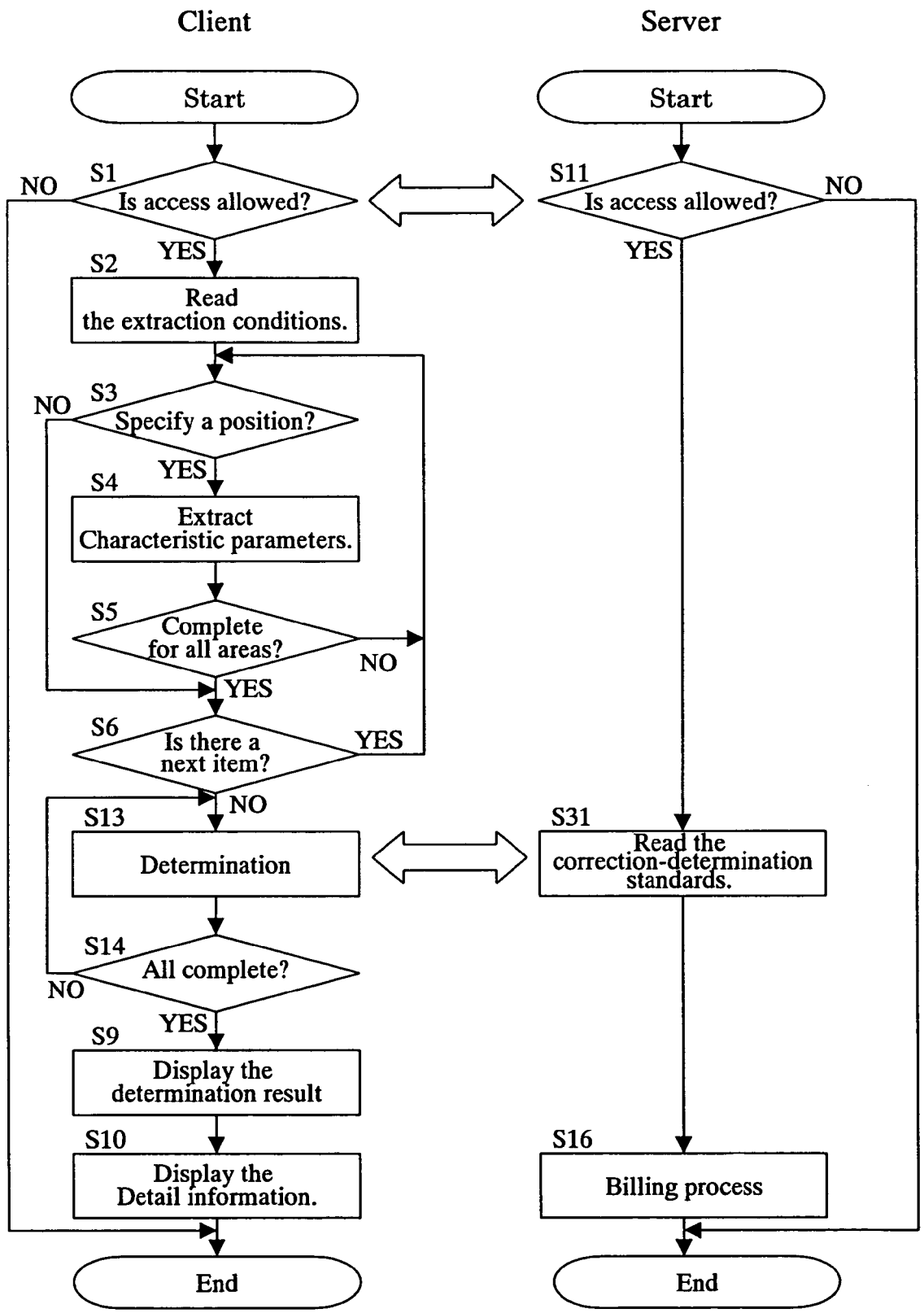
FIG. 11 is a flowchart showing the flow of the processing of a third embodiment of the invention.

In other words, after the client apparatus 1a executes the characteristic-parameter-extraction process (FIG. 11, S1 to S6) on the input CAD layout data as explained in the first embodiment, the correction-determination means 17 of the client apparatus 1a performs determination to determine whether or not it is necessary to correct the CAD layout data (FIG. 11, S13 and S14). At this time, the correction-determination means 17 reads the correction-determination standards 34 that correspond to the item numbers 31 from the database stored in the storage means 16 of the server apparatus 2 and references them (FIG. 11, S31).

The operation when this determination result is displayed on the display of the client apparatus 1a is the same as the operation of the client apparatus 1a after it received the determination result in the first embodiment, so an explanation of it will be omitted here.

In this embodiment, as in the first embodiment, it is possible to check electrical characteristics without having to make available information to the user such as the detail circuit design or board layout.

In the explanation above, the client apparatus 1a was constructed such that it comprised beforehand the position-specification means 12, characteristic-parameter-extraction means 13 and correction-determination means 17, however the invention is not limited to this. For example, the same effect can be obtained by constructing the server apparatus 2 such that a program that makes the client apparatus 1a execute the position-specification process and characteristic-parameter-extraction process (FIG. 2, S2 to S6) and a program that makes the client apparatus client apparatus 1a execute the correction-determination process (FIG. 11, S13 and S14) are stored in the storage means 16, and the client apparatus 1a acquires these programs from the server apparatus at the start of the design check.

Moreover, in the case of this construction in which the client apparatus 1a acquires programs from the server apparatus 2 in this way, by deleting the programs according to an instruction from the server apparatus 2 when checking of the electrical characteristics of the CAD layout is completed, it is possible to improve confidentiality since a third party cannot analyze the programs.

Embodiment 4

Figure 12:
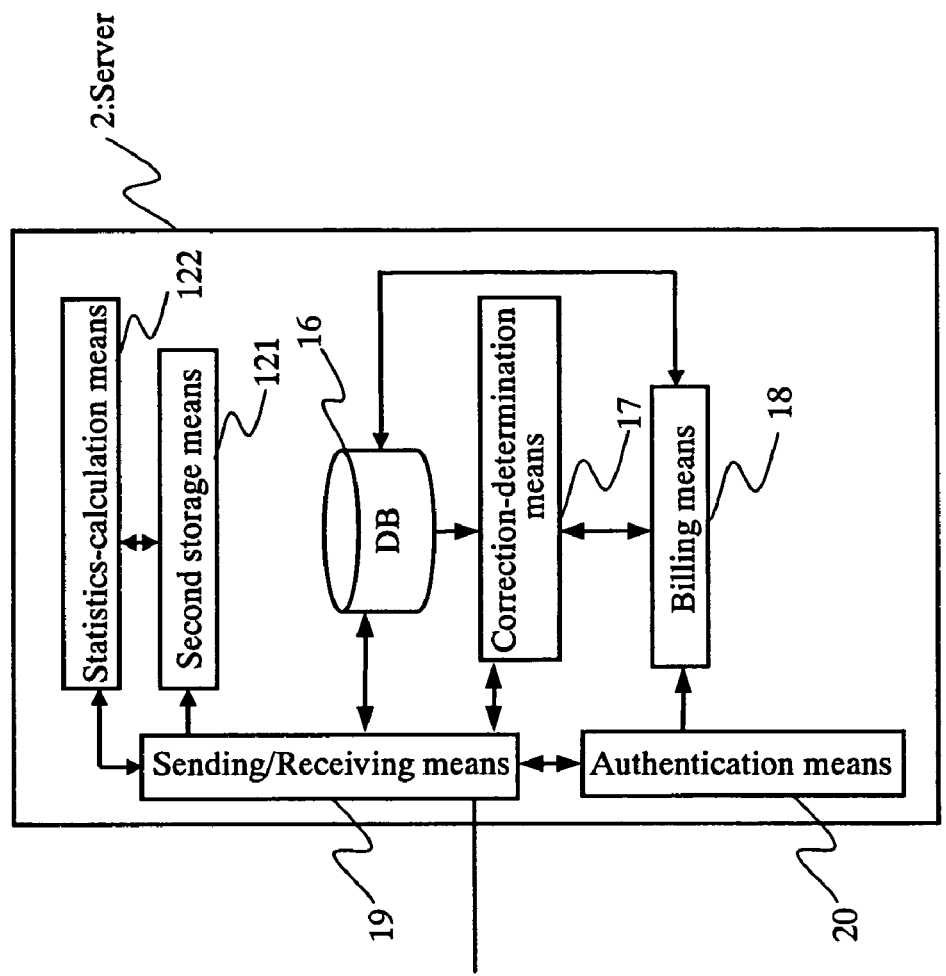
FIG. 12 is a schematic drawing showing the construction of a fourth embodiment of the invention.

In this embodiment, the server apparatus 2 explained in the embodiments described above further comprises a second storage means 121 that collects the characteristic parameters extracted from the CAD layout data, and a statistics-calculation means 122 that calculates statistics such as the average value and maximum value of the collected characteristic parameters. Here, the case of applying this embodiment to the server apparatus 2 explained in the first embodiment will be explained with reference to the schematic drawing of the server apparatus 2 shown in FIG. 12.

As was explained for the first embodiment, when the user starts a design check on a CAD layout data, the characteristic parameters and coordinates of the extraction position that were extracted by the client apparatus 1a and the item numbers 31 are sent to the server apparatus 2. In this embodiment, the characteristic parameters that were received by the server apparatus 2 are stored in the second storage means 121 in order together with the item numbers 31.

When a design check is started for another CAD layout data with the characteristic parameters collected in the second storage means 121 in this way, the statistics-calculation means 122 reads all of the characteristic parameters that correspond to the item numbers 31 that were received together with the characteristic parameters from the second storage means 121, then calculates the statistical values such as the average and maximum value for the characteristic parameters and sends them to the client apparatus 1a.

There are characteristic parameters that are extracted from the CAD layout data, such as the coordinates that are recorded for item number '2' in FIG. 2, that are not appropriate for calculation of the statistical values. Therefore, in this embodiment, item numbers 31 of the characteristic-parameter items 33 for which statistical values will be calculated are set beforehand in the statistics-calculation means 122, and the statistics-calculation means 122 calculates statistical values only for the characteristic parameters that correspond to the set item numbers 31.

In this embodiment, in order to simplify the management of characteristic-parameter items 33 for which statistical values are calculated in this way, in addition to the characteristic-parameter items 33 explained in the first embodiment, characteristic-parameter items 33 that are only used for the purpose of calculating statistical values are registered in the database stored in the storage means 16 of the server apparatus 2. In the example shown in FIG. 13, the position-specification condition 'LSI' is registered for item number '100', and 'the number of power-supply pins and the number of bypass capacitors' are registered as the characteristic parameter item 33.

In this case, from the CAD layout data, the position-specification means 12 of the client apparatus 1a specifies 'LSI' as the position-specification condition 32 corresponding to the item number '100' stored in the storage means 16. Also, the characteristic-parameter-extraction means 13 extracts the number of power-supply pins of the specified LSI and the number of bypass capacitors connected to the power-supply pins as characteristic parameters and sends the values to the server apparatus 2.

Also, before the design check is executed, the statistics-calculation means 122 reads the characteristic parameters that correspond to item number '100' that are stored in the storage means 122 and calculates the statistical values and sends them to the client apparatus 1a. At this time, the correction-determination standards corresponding to item number '100' are not registered in the database, so the correction-determination means 17 does not determine whether or not it is necessary to correct the CAD layout.

Figure 5:
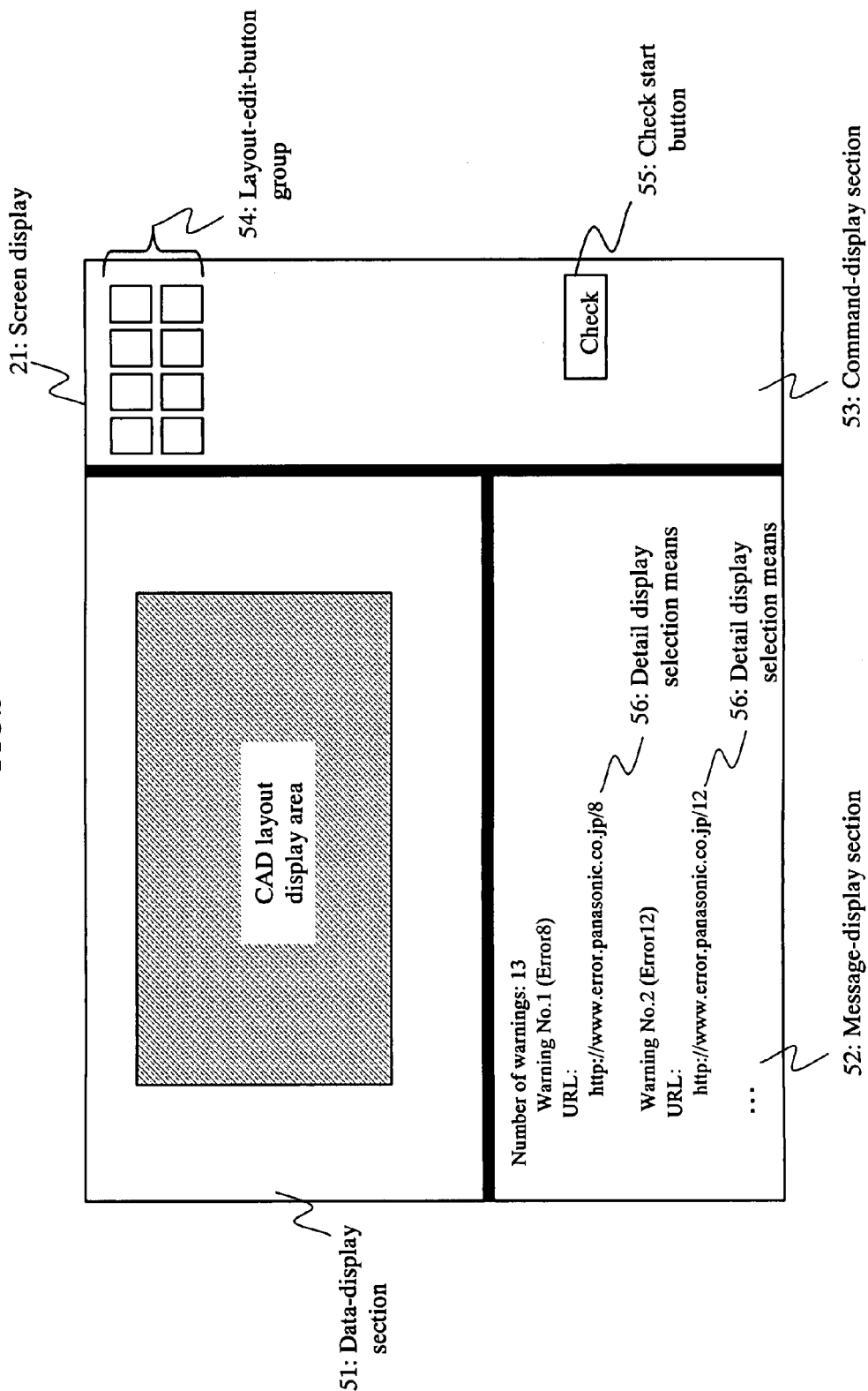
FIG. 5 is a schematic drawing showing an example of a screen display of a client apparatus in a first embodiment of the invention.

In this way, the statistical values that are sent to the client apparatus 1a are displayed in the message-display section 52 of the display screen 21 shown in FIG. 5, for example, 'In comparison to the average value of 1.3 bypass capacitors used per one power-supply pin, in this design there is 0.7 bypass capacitors per power-supply pin'.

With this construction, it is possible for the user to compare his/her design values with the average design value of other users, better understand his/her own design trends.

Embodiment 5

In this embodiment, the server apparatus 2 explained in the embodiments described above further comprises a layout-design-information-reading means 141. Here, the case of applying this construction to the server apparatus 2 explained in the first embodiment will be explained with reference to the schematic drawing of the server apparatus 2 shown in FIG. 14.

In the embodiments described above, CAD layout data is input to the client apparatus 1a, however in this embodiment, circuit-design data is input instead of the CAD layout data.

Figure 14:
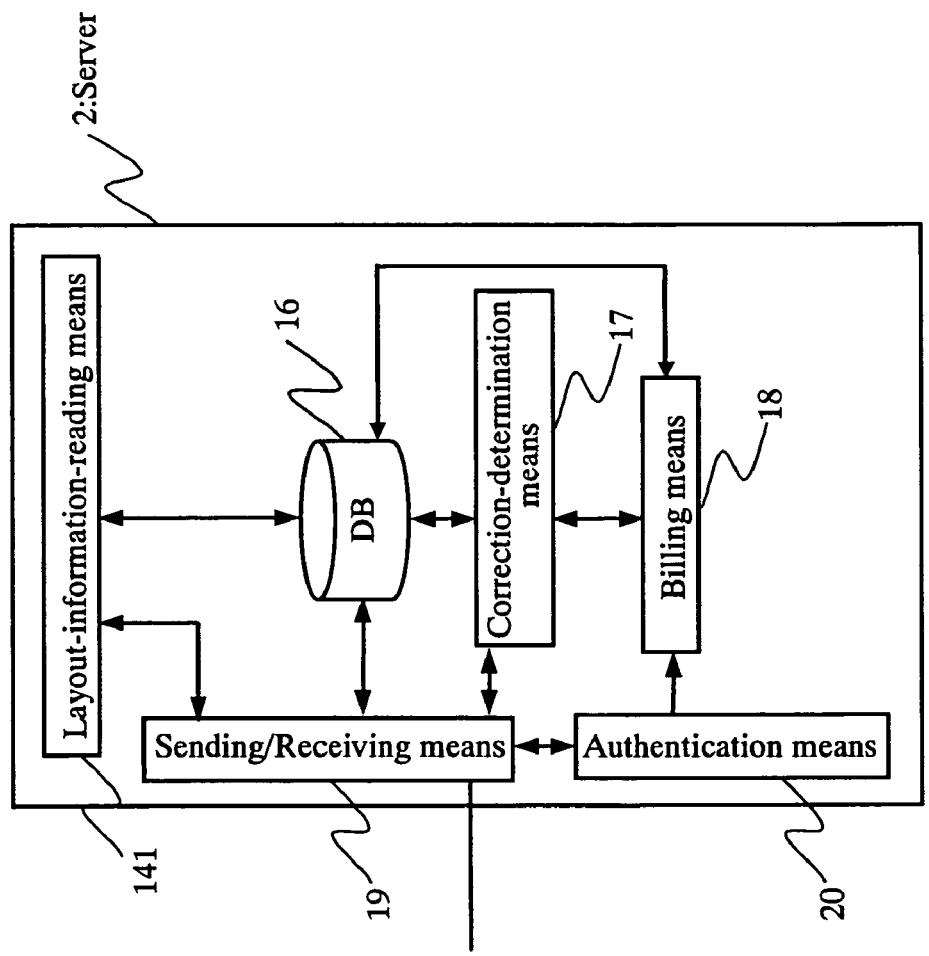
FIG. 14 is a schematic drawing showing the construction of a fifth embodiment of the invention.

When the design check begins with the circuit-design data input in this way, the position-specification means 12 specifies the position from the circuit-design data based on the position-specification conditions 32 that can specify a position by just the circuit-design data, and the characteristic-parameter-extraction means 13 extracts the characteristic parameters for that specified position. Here, the position-specification conditions 32 that can specify a position by just the circuit-design data are the 'bypass capacitors' that are located between the power-supply line and the grounding plane, and the 'damping resistors' located between the clock pins of the LSI. As shown in FIG. 14, these kinds of position-specification conditions 32 are correlated with the item numbers 31 and characteristic-parameter items 33 and registered in the database. In the example shown in FIG. 14, 'bypass capacitor' is registered as the position-specification condition 32 and 'power-supply pin' is registered as the characteristic-parameter item for item number '200'.

The steps of the position-specification process and characteristic-parameter process are the same as the steps in the first embodiment, so here an explanation of them is omitted.

Figure 17:
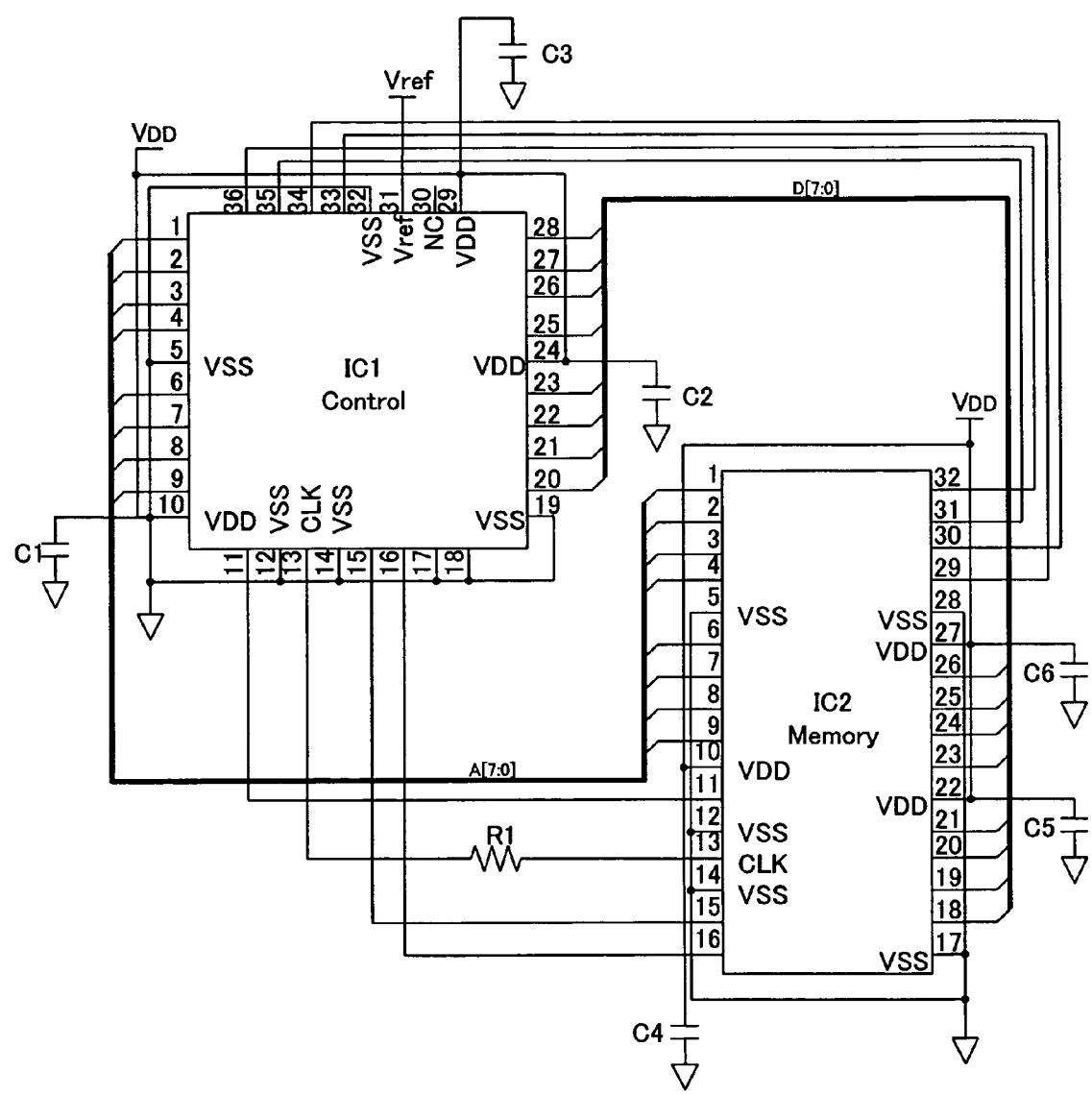
FIG. 17 is a circuit diagram explaining the operation of a fifth embodiment of the invention.

In this state, the case where circuit-design data for a circuit in which the control IC (IC1) and memory IC (IC2) are connected as shown in FIG. 17 is input in the client apparatus 1a, is explained below. The numbers around each IC shown in FIG. 17 indicate the pin numbers of the respective IC.

In this case, the position-specification means 12 and characteristic-parameter-extraction means 13 obtain 'C1 and pin No. 10 of IC1', 'C2 and pin No. 24 of IC1', . . . , 'C6 and pin No. 27 of IC2' as combinations of specified positions and characteristic parameters for item number '200'.

On the other hand, the layout-design information 35, which is information related to the layout design, is correlated with the item numbers 31 and registered in the database. In other words, as shown in FIG. 15, the layout-design information 35, 'bypass capacitors are located such that the distance to the power-supply pin is a minimum', is registered in the database for item number '200' for which 'bypass capacitor' is registered.

In the server apparatus 2, the item numbers 31 that are send from the characteristic-parameter-extraction means 13 are input in order in the layout-information-reading means 141. For example, when item number '200' is input, the layout-information-reading means 141 reads the layout-design information 35 corresponding to item number '200', which is 'the bypass capacitor is placed such that the distance to the power-supply pin or distance from the outside to the power-supply-input means is a minimum', from the database, and sends that layout-design information 35 to the client apparatus 1a. At that time, item number '200' is also input to the correction-determination means 17, however, since the correction-determination standards corresponding to item number '200' are not registered in the database, the correction-determination means 17 does not determine whether or not it is necessary to correct the CAD layout data.

The client apparatus 1a that received the layout-design information 35 displays the combinations of specified positions and characteristic parameters that correspond to that layout-design information 35 in the message-display section 52 of the display screen 21 shown in FIG. 5. In other words, in the above example, 'bypass capacitor C1 is placed such that the distance to pin No. 10 of IC1 is a minimum', and the like is displayed.

At this time, by writing the layout-design information 35 in the header as additional information to the input circuit-design data, it is possible to check that information by referencing the circuit-design data when performing circuit-board design based on the circuit-design data.

This embodiment performs the design check for the circuit-design data, so the client apparatus 1a comprises the item-selection means 71 that was explained in the first embodiment, and it is preferred that the design-check system of this embodiment be constructed such that it executes the design check only for position-specification conditions 32 that can specify a position with just the circuit-design data.

In this way, by executing the design check in the circuit design stage, the user is able to obtain information from the database related to the layout design, and reflect that information on the CAD layout design.

In each of the embodiments described above, the client apparatus 1a can also comprise a DRC (Design Rule Check) function that checks whether or not design rules (minimum line width, minimum line spacing, via hole size, etc.) that are regulated by the circuit-board manufacturing process are satisfied. By doing this it is possible to check for violation of design rules while checking the electrical characteristics, so it is very efficient.

(Example 1 of Poor Electrical Characteristics)

An example of poor electrical characteristics for which the check of the design-check system of this invention is performed is given below.

The example shown in FIG. 18(a) is an example of a multi-layer circuit board in which the inner wiring layer is the ground plane and the signal lines 81 are formed on the other layers, and where the signal lines 81 are located across a slit 83 that divides the ground plane 82. In a multi-layer circuit board where the signal lines 81 that surround the ground plane 82 are connected by a via hole and power is supplied to the other layers from the power-supply plane 86, this kind of slit 83 in the ground plane 82 may occur along the clearance land of a via hole that passes through the ground plane 82. Also, this kind of slit 83 in the ground plane 82 may occur when the ground plane 82 is divided into a digital ground area and analog ground area.

When there is no slit in the ground plane 82, the current flows in the signal line 81 and a return current 84 flows on the ground plane in the opposite direction of that current and the electromagnetic waves that occur cancel each other out.

However, when there is a slit 83 in the path of flow of this return current 84, the return current 84 flows around the outside of that slit 83. Therefore, the electromagnetic waves that due to the current flowing in the signal line 81 and the return current 84 do not cancel each other out. In this kind of state, radiated noise is generated proportional to the loop area 85, which is the area of the plane formed by the path of the return current 84 and the signal line 81.

This amount of radiated noise (E), as shown in Equation 1, depends on the frequency (f) of the signal transmitted in the signal line, the amount of current (I) that flows in the signal line, and the loop area 85 (A).

$$E = k*I*A*f^2/R \quad \text{(Equation 1)}$$

In Equation 1, k is constant that is obtained from actual measurement, and R is the distance from the circuit board to the position where the intensity of the radiated noise is measured (for example, 3 m).

In this example, the position-specification condition is 'a position where there is a signal line that locates on slits in the ground plane'. Also, the extracted characteristic parameter items are 'the frequency of the signal transmitted in the signal line', 'the current flowing in the signal line', and 'the loop area'.

Moreover, the maximum allowable value of the amount of generated radiated noise (E) is set as an upper limit, and the correction-determination standard becomes 'when the amount of radiated noise calculated from the characteristic parameters exceeds the upper limit'.

(Example 2 of Poor Electrical Characteristics)

Figure 19:
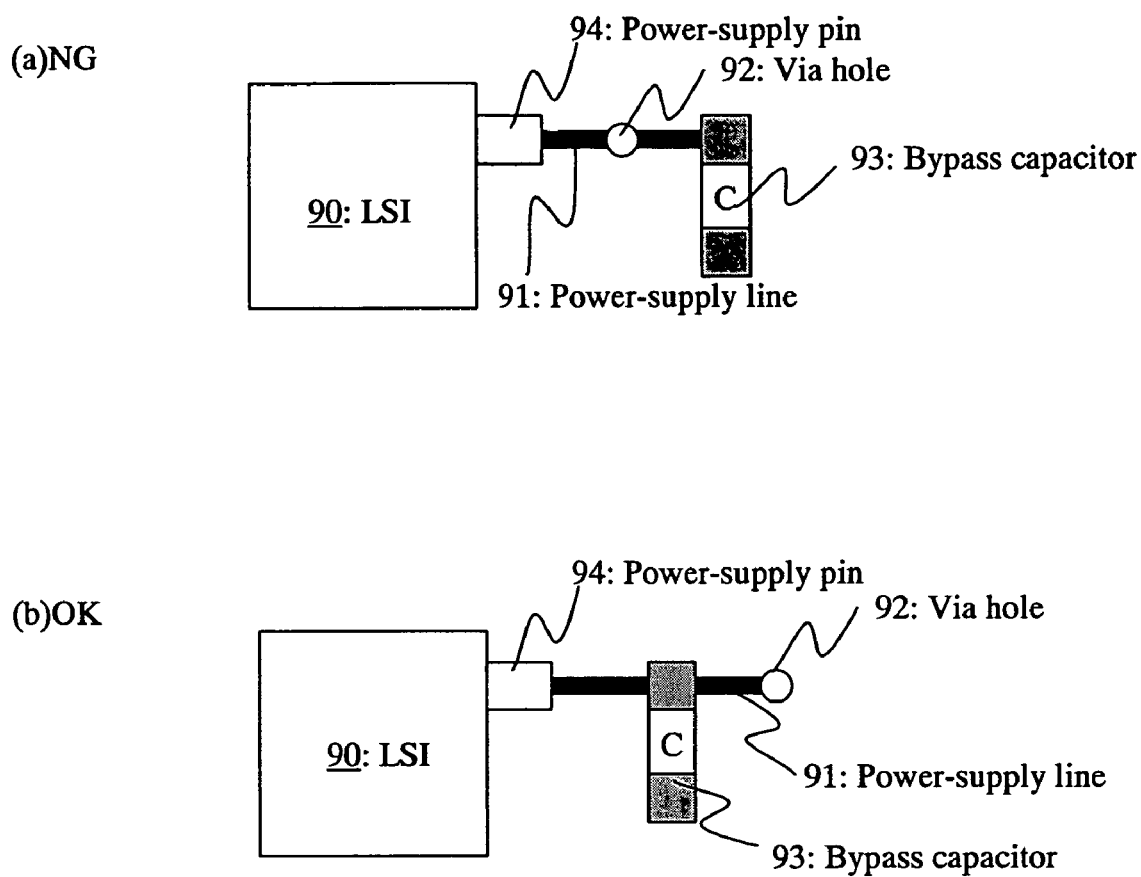
FIG. 19(a) and FIG. 19(b) are drawings showing an example of when problems with electrical characteristics occur.

The example shown in FIG. 19(a) is an example where in a multi-layer circuit board, a power-supply line 91 is formed on the top plane, and a third wiring layer is used as the power-supply plane by way of an insulating layer, and where a bypass capacitor 93 is connected to one end of the power-supply line 91 that supplies power from the power-supply plane to the LSI by way of the via hole and the other end is connected to ground.

In the case where the power-supply pin 94 of the LSI 90, the via hole 92 the connects to the power-supply plane, and the bypass capacitor 93 are connected in the order shown in FIG. 19(a), part of the high-frequency current that flows out from the power-supply pin 94 of the LSI 90 flows to the power-supply plane by way of the via hole 92 without flowing to the bypass capacitor 93. The current that flows to this power-supply plane causes the potential on the power-supply plane to fluctuate and so radiated noise is generated. Therefore, as shown in FIG. 19(b) a CAD layout in which the bypass capacitor 93 is located between the LSI 90 and the via hole 92 is better.

In this example, the position-specification conditions are 'positions where there is an LSI', 'a via hole connected to the power-supply plane', and 'a bypass capacitor and power-supply line'. Also, the extracted characteristic parameter items are 'the coordinates of the power-supply pin of the LSI', 'the coordinates of the power-supply line', 'the coordinates of the bypass capacitor', and 'coordinates of the via hole that connects to the power-supply plane', and the correction-determination standard is that 'there is no bypass capacitor between the via hole and power-supply pin of the LSI'.

(Example 3 of Poor Electrical Characteristics)

The example shown in FIG. 20, is an example where in a multi-layer circuit board, a signal line 101 is formed on the wiring layer on the top plane, and the second wiring layer, by way of the insulating layer, is used as the ground plane 102, and the signal line 101 located on the edge of the circuit board.

As shown in FIG. 20(*a*), when the signal line 101 is located on the edge of the circuit board, the electric field the is generated by the signal transmitted in the signal line 101 leaks outside of the circuit board without closing the circuit with the ground plane 102. This electric field that leaks outside of the circuit board generates radiated noise. This leakage of electric field becomes larger the higher the frequency is of the signal transmitted in the signal line 101. Therefore, as shown in FIG. 20(*b*), a layout in which the signal line 101 is located at a specified distance on the inside from the edge of the circuit board such that the electric field does not leak to the outside is better. The case where the signal line is located on the middle layer and there is a ground plane above and below it, the leakage of the electric field is different, so it is an example different from this example.

In the case of this example, the position-specification condition is that 'the signal line is formed on the top plane on the edge of the circuit board'. Also, the extracted characteristic parameter items are, 'the distance from the edge of the circuit board to the signal line', the layer on which the signal line is located', 'the maximum frequency of the signal transmitted in the signal line (in the case of a pulse signal, this is calculated from the rise time or fall time)', and 'the circuit-board layer construction', and the correction-determination standard is that 'the signal line, along which a signal having a maximum frequency that is greater than a specified frequency, is located a specified distance from the edge of the circuit board'.

(Example 4 of Poor Electrical Characteristics)

The example shown in FIG. 21 is an example where in a multi-layer circuit board the two inner wiring layers are arranged as the ground plane 111 and power-supply plane 112.

In the case where the ground plane 111 and power-supply plane 112 are located on the inner layers, when the end section of the ground plane 111 and the end plane of the power-supply plane 112 are lined up, the electric field flows from the power-supply plane 112 toward the ground plane 111 as shown in FIG. 21(*a*), and reaches the ground plane 111 by way of going outside the circuit board. This leakage outside of the circuit board of the electric field generates radiated noise. Therefore, as shown in FIG. 21(*b*), a layout in which the end sections of the power-supply plane 112 are located a specified width further on the inside than the ground plane 111, and there is no leakage of electric field to the outside is better.

In this example, the position-specification condition is that 'there is a ground plane and a power-supply plane'. Also, the extracted characteristic-parameter items are 'the circuit-board layer construction', 'coordinates of the power-supply plane (coordinates of a point on the plane)', and 'coordinates of the ground plane (coordinates of a point on the plane)', and the correction-determination standard is that 'the end sections of the power-supply plane are located further on the inside by a specified width than the end sections of the ground plane'.

While the invention has been described in detail, the foregoing description is in all aspects illustrative and not restrictive. It is understood that numerous other modifications and variations can be devised without departing from the scope of the invention.

What is claimed is:

1. A design-check system that checks electrical characteristics of CAD layout data for a printed circuit board, comprising:
   storage means that stores position-specification conditions that specify a position from said CAD layout data where there is a possibility that poor electrical characteristics will occur due to an influence of CAD layout, characteristic parameters to be extracted, and correction-determination standards that are standards for determining whether or not it is necessary to correct said CAD layout data, which are correlated and registered in a database for each predicted cause of poor electrical characteristics;
   position-specification means that specifies the position of poor electrical characteristics from said CAD layout data based on said position-specification conditions;
   characteristic-parameter-extraction means that is operable to extract said characteristic parameters from said specified position;
   correction-determination means that determines whether or not it is necessary to correct said CAD layout data by comparing the characteristic parameters extracted by said characteristic-parameter-extraction means and said correction-determination standards that correspond to the characteristic parameters read from said storage means;
   display means that displays a determination result made by said correction-determination means; and
   selection means operable to, when selected, display on said display means detail information related to error correction registered in said database, when said correction-determination means determines that correction of said CAD layout data is needed.

2. The design-check system of claim 1, further comprising a client apparatus to which said CAD layout data is input; a server apparatus that is connected with said client apparatus via a network;
   said server apparatus comprising:
      said storage means;
      said position-specification means;
      said characteristic-parameter-extraction means; and
      said correction-determination means; and
   said client apparatus comprising:
      said display means; and
      said selection means,
   wherein the client apparatus acquires said determination result via said network.

3. The design-check system of claim 1, further comprising a client apparatus to which said CAD layout data is input; a server apparatus that is connected with the client apparatus via a network;
   said client apparatus comprising:
      said position-specification means;
      said characteristic-parameter-extraction means;
      said display means; and
      said selection means; and
   said server apparatus comprising:
      said storage means; and
      said correction-determination means,
   wherein said client apparatus sends the extracted parameters to said server apparatus, and said server apparatus sends said determination result to said client apparatus, and has said determination result displayed on said display means of the client apparatus.

4. The design-check system of claim 3 wherein:
said client apparatus acquires said position-specification means and characteristic-parameter-extraction means from said server apparatus via said network when it is necessary.

5. The design-check system of claim 1, further comprising:
a client apparatus to which said CAD layout data is input;
a server apparatus that is connected with the client apparatus via a network; and
said client apparatus comprising:
said position-specification means;
said characteristic-parameter-extraction means; and
said correction-determination means;
said display means; and
said selection means
wherein said client apparatus performs determination based on said correction-determination standards that are stored in said storage means of said server apparatus.

6. The design-check system of claim 5 wherein:
said client apparatus acquires said position-specification means, said characteristic-parameter-extraction means, and said correction-determination means from said server apparatus via said network when it is necessary.

7. The design-check system of claims 2 to 6 wherein:
said server apparatus further comprises a billing means that performs billing according to access of said database from said client apparatus.

8. The design-check system of claims 2 to 6 wherein said server apparatus further comprises:
a second storage means that collects the characteristic parameters extracted from said CAD layout data;
a statistics-calculation means that calculates statistical values for the collected characteristic parameters; and
said server apparatus sends those statistical values to said client apparatus.

9. The design-check system of claims 2 to 6 wherein, when circuit-design data is input instead of said CAD layout data, said position-specification means specifies the position from said circuit-design data based on position-specification conditions that can specify the position with just said circuit-design data, and said server apparatus sends information related to a layout design that corresponds to those position-specification conditions that are registered in said database to the client apparatus.

10. A server apparatus that is used in a design-check system and checks electrical characteristics of CAD layout data for a printed circuit board, and sends a check result to a client apparatus, the server apparatus comprising:
storage means that stores position-specification conditions that specify a position from said CAD layout data where there is a possibility that poor electrical characteristics will occur due to an influence of the CAD layout, characteristic parameters to be extracted at the specified position, and correction-determination standards that are standards for determining whether or not it is necessary to correct the CAD layout data, which are correlated and registered in a database for each predicted cause of the poor electrical characteristics; and
correction-determination means that receives the characteristic parameters that were extracted by the client apparatus for a position specified from the input CAD layout data based on said position-specification conditions, and determines whether or not it is necessary to correct the CAD layout by comparing the characteristic parameters with correction-determination standards that correspond to the characteristic parameters read from said storage means, and then sends the determination result to said client apparatus,
wherein detail information related to error correction registered in said database is sent to said client apparatus in response to a user request when it is determined that correction of said CAD layout is needed.

11. A client apparatus that is used in a design-check system with a server apparatus, and receives a check result of electrical characteristics of CAD layout data from said server apparatus, the client apparatus comprising:
position-specification means that specifies a position from said CAD layout data based on position-specification conditions that specify the position where there is a possibility of the occurrence of poor electrical characteristics due to an influence of CAD layout;
characteristic-parameter-extraction means that extracts characteristic parameters at said specified position, and sends those characteristic parameters to said server apparatus;
display means that displays the check result received from the server apparatus; and
selection means that is operable to, when selected, display on the display means detail information related to the check result registered in said server apparatus, when said server apparatus determines that the correction of said CAD layout data is needed.

12. A computer program product including a computer readable medium bearing a program for a design-check system that checks electrical characteristics of CAD layout data for a printed circuit board, the program, when executed, causing the design-check system to perform the steps of:
specifying a position from said CAD layout data based on position-specification conditions that specify the position where there is a possibility of the occurrence of poor electrical characteristics due to an influence of the CAD layout;
extracting characteristic parameters at the specified position;
reading correction-determination standards, which correspond to the characteristic parameters extracted from said CAD layout data, from a database in which said position-specification conditions, characteristic parameters to be extracted, and correction-determination standards which are standards for determining whether or not it is necessary to correct the CAD layout data, are correlated and registered for each predicted cause of poor electrical characteristics;
determining whether or not it is necessary to correct the CAD layout data by comparing the characteristic parameters extracted from said CAD layout data with the correction-determination standards that are read from said database;
displaying a determination result; and
displaying detail information related to error correction in response to a user request, when it is determined that correction of said CAD layout data is needed.

13. The computer program-product of claim 12, wherein said design-check system comprises a client apparatus and a server apparatus, and
the program causes a client apparatus to execute the steps of specifying said position, extracting said characteristic parameters, and sending the extracted characteristic parameters to the server apparatus, displaying the determination result, and displaying detail information in response to the user request; and causes said server apparatus to execute the steps of reading said correction-determination standards, and determining whether or not said correction is necessary.

14. The program product of claim 13, wherein the program causes said client apparatus, instead of said server apparatus, to execute the step of determining whether or not said correction is necessary.

15. A design-check method that checks electrical characteristics of CAD layout data for a printed circuit board, comprising the steps of:
- specifying a position from said CAD layout data based on position-specification conditions that specify the position where there is a possibility of the occurrence of poor electrical characteristics due to an influence of the CAD layout;
- extracting characteristic parameters at the specified position;
- reading correction-determination standards, which correspond to the characteristic parameters extracted from said CAD layout data, from a database in which said position-specification conditions, characteristic parameters to be extracted, and said correction-determination standards which are standards for determining whether or not it is necessary to correct the CAD layout data, are correlated and registered for each predicted cause of poor electrical characteristics;
- determining whether or not it is necessary to correct the CAD layout by comparing the characteristic parameters extracted from said CAD layout data, and the correction-determination standards that are read from said database;
- displaying a determination result; and
- displaying detail information related to error correction in response to a user request, when it is determined that the correction of said CAD layout data is needed.

16. A design-check method in which a server apparatus and a client apparatus communicate with each other to check electrical characteristics of CAD layout data for a printed circuit board, the method comprising the steps of:
- specifying a position from said CAD layout data based on position-specification conditions that specify the position where there is a possibility of poor electrical characteristics due to an influence of CAD layout;
- extracting characteristic parameters at the specified position;
- sending the extracted characteristic parameters to the server apparatus;
- in said server apparatus, reading correction-determination standards that correspond to said characteristic parameters from a database in which said position-specification conditions, characteristic parameters to be extracted, and correction-determination standards which are standards for determining whether or not it is necessary to correct the CAD layout data, are correlated and registered;
- in said server apparatus, comparing said received characteristic parameters and correction-determination standards read from said database, and determining whether or not it is necessary to correct the CAD layout data;
- sending said determination result to said client apparatus;
- in said client apparatus, displaying a determination result, and
- in said client apparatus, displaying detail information related to error correction in response to a user request, when it is determined that correction of said CAD layout data is needed.

17. The design-check method of claim 16, further comprising a step of acquiring by said client apparatus a program from said server apparatus that causes said client apparatus to execute the steps of specifying said position and extracting said characteristic parameters.

18. The design-check method of claim 17, further comprising a step of acquiring by said client apparatus a program from said server apparatus that causes said client apparatus to execute the step of determining whether or not said correction is necessary before executing said step of determining whether or not said correction is necessary by said server apparatus.

19. A computer program product including a computer readable medium bearing a program for a server of a design-check system to check electrical characteristics of CAD layout data for a printed circuit board, and to send a check result to a client, said client configured for specifying a position from said CAD layout data based on position-specification conditions that specify the position where there is a possibility of the occurrence of poor electrical characteristics due to an influence of the CAD layout; and extracting characteristic parameters at the specified position, the program, when executed, causing the server to perform the steps of:
- reading correction-determination standards, which correspond to the characteristic parameters extracted from said CAD layout data, from a database in which said position-specification conditions, characteristic parameters to be extracted, and correction-determination standards which are standards for determining whether or not it is necessary to correct the CAD layout data, are correlated and registered for each predicted cause of poor electrical characteristics;
- determining whether or not it is necessary to correct the CAD layout data by comparing the characteristic parameters extracted from said CAD layout data with the correction-determination standards that are read from said database;
- sending a determination result to said client; and
- sending said client detail information related to error correction in response to client's request when it is determined that correction of said CAD layout data is needed.

20. A computer program product including a computer readable medium bearing a program for a client of a design-check system to check electrical characteristics of CAD layout data for a printed circuit board, the program, when executed, causing the client to perform the steps of:
- specifying a position from said CAD layout data based on position-specification conditions that specify the position where there is a possibility of the occurrence of poor electrical characteristics due to an influence of the CAD layout;
- extracting characteristic parameters at the specified position;
- causing a server of the design-check system to read correction-determination standards which correspond to the characteristic parameters extracted from said CAD layout data, from a database in which said position-specification conditions, characteristic parameters to be extracted, and correction-determination standards which are standards for determining whether or not it is necessary to correct the CAD layout data, are correlated and registered for each predicted cause of poor electrical characteristics, and to determine whether or not it is necessary to correct the CAD layout data by comparing the characteristic parameters extracted from said CAD layout data with the correction-determination standards that are read from said database;
- displaying a determination result received from the server; and
- displaying detail information related to error correction in response to client's request, when it is determined that correction of said CAD layout data is needed.

* * * * *